United States Patent [19]

Akimoto et al.

[11] Patent Number: 5,620,560
[45] Date of Patent: Apr. 15, 1997

[54] METHOD AND APPARATUS FOR HEAT-TREATING SUBSTRATE

[75] Inventors: Masami Akimoto, Kumamoto; Yasuhiro Sakamoto; Kouji Harada, both of Kumamoto-ken, all of Japan

[73] Assignees: Tokyo Electron Limited, Tokyo; Tokyo Electron Kyushu Limited, Tosu, both of Japan

[21] Appl. No.: 538,589

[22] Filed: Oct. 3, 1995

[30] Foreign Application Priority Data

Oct. 5, 1994 [JP] Japan .................................. 6-264424

[51] Int. Cl.$^6$ .................................................. H01L 21/00
[52] U.S. Cl. .......................... 216/41; 156/345; 438/948; 430/330
[58] Field of Search ............................. 156/643.1, 657.1, 156/659.11, 345; 118/724, 725, 728; 204/298.31, 298.35; 437/247, 248

[56] References Cited

U.S. PATENT DOCUMENTS 5,252,807 10/1993 Chizinsky .......................... 118/724 X

FOREIGN PATENT DOCUMENTS 3-38636 4/1991 Japan .
6-283413 10/1994 Japan .

Primary Examiner—William Powell
Attorney, Agent, or Firm—Oblon, Spivak, McClelland, Maier & Neustadt, P.C.

[57] ABSTRACT

A heat-treating method of heating and cooling a substrate comprising the steps of carrying the wafer into a heat-treating section by a main arm and mounting the wafer on a heating stage, heating the wafer mounted on the heating stage, lifting the wafer thus heated from the heating stage, approaching a cooling holder to the wafer thus lifted to cool the wafer above the heating stage, and carrying the cooled wafer from above the heating stage.

28 Claims, 14 Drawing Sheets

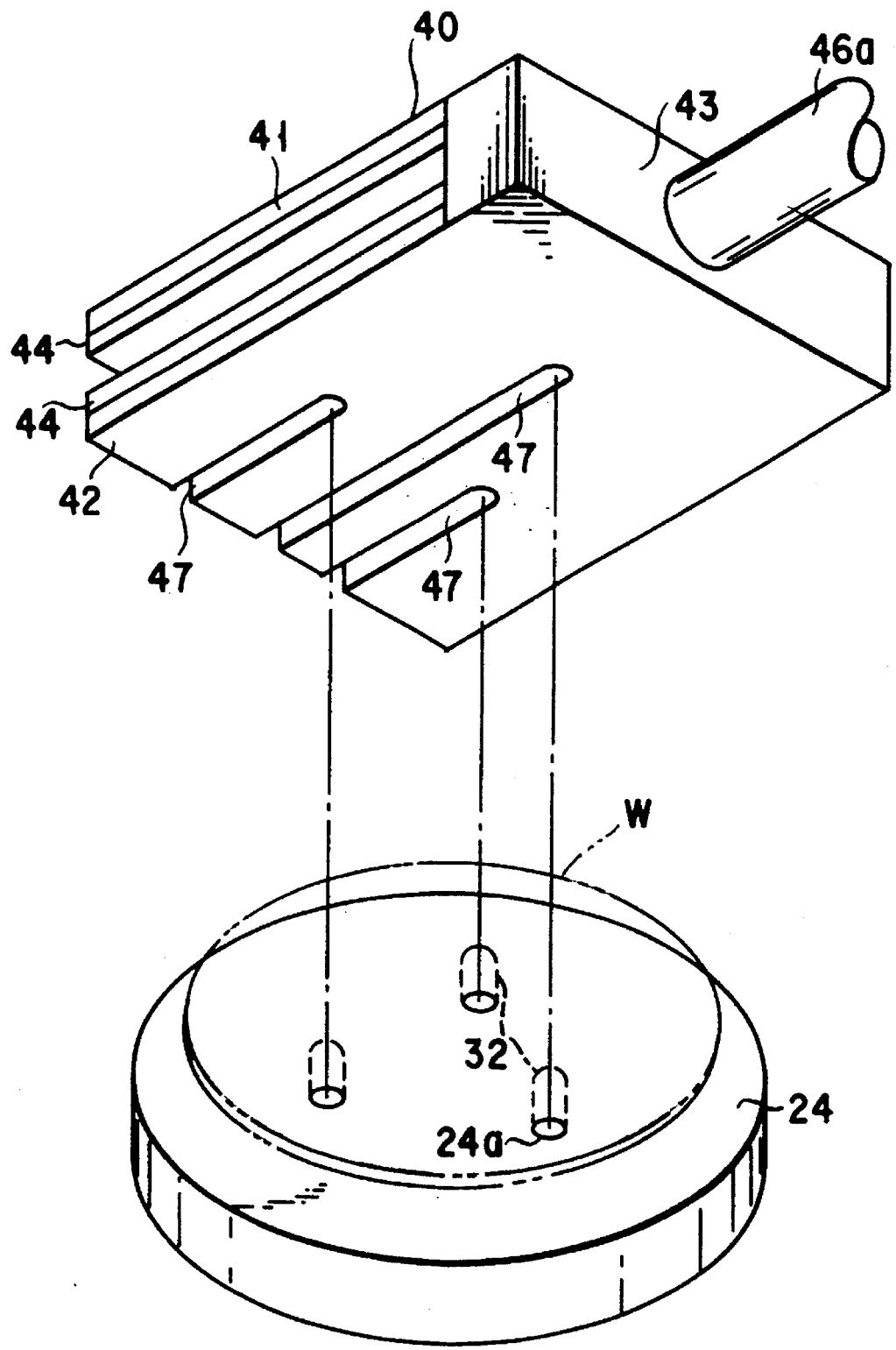
F I G. 3

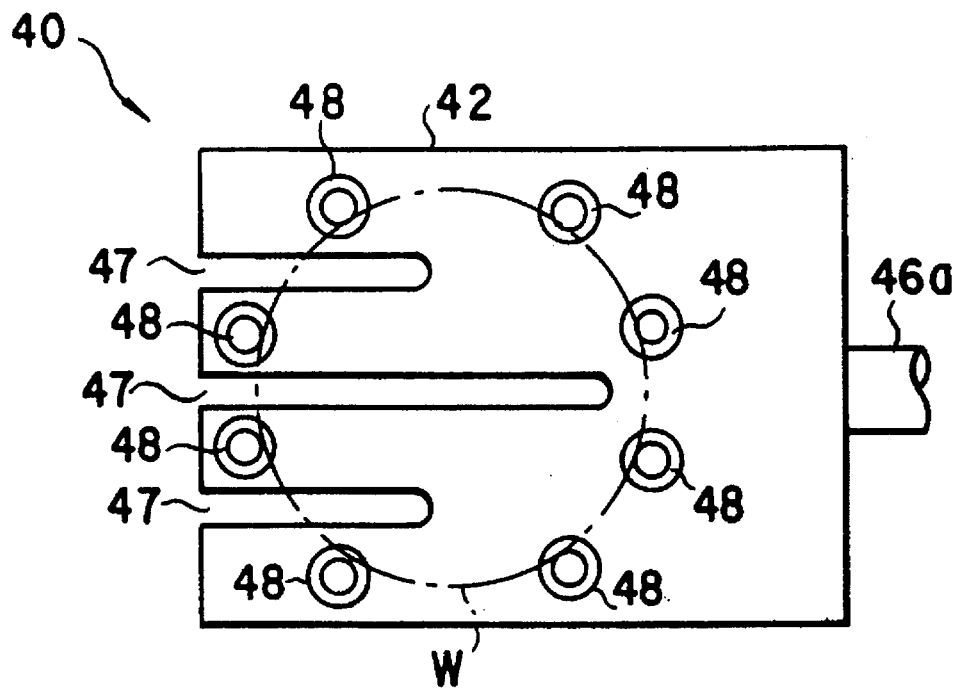
F I G. 5
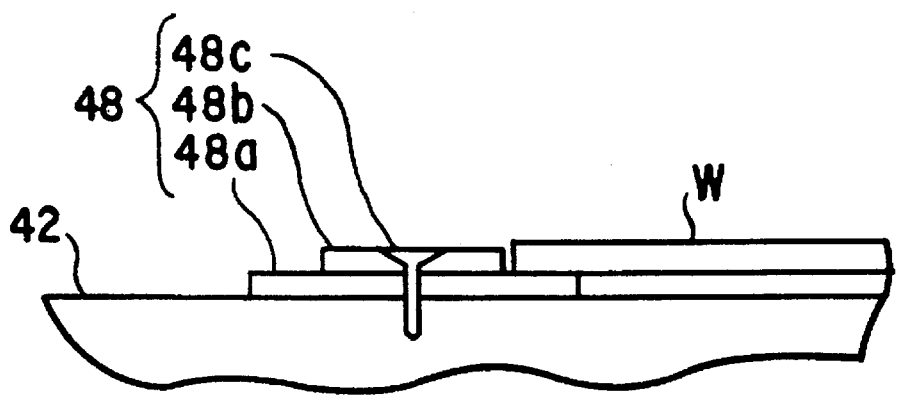
F I G. 6

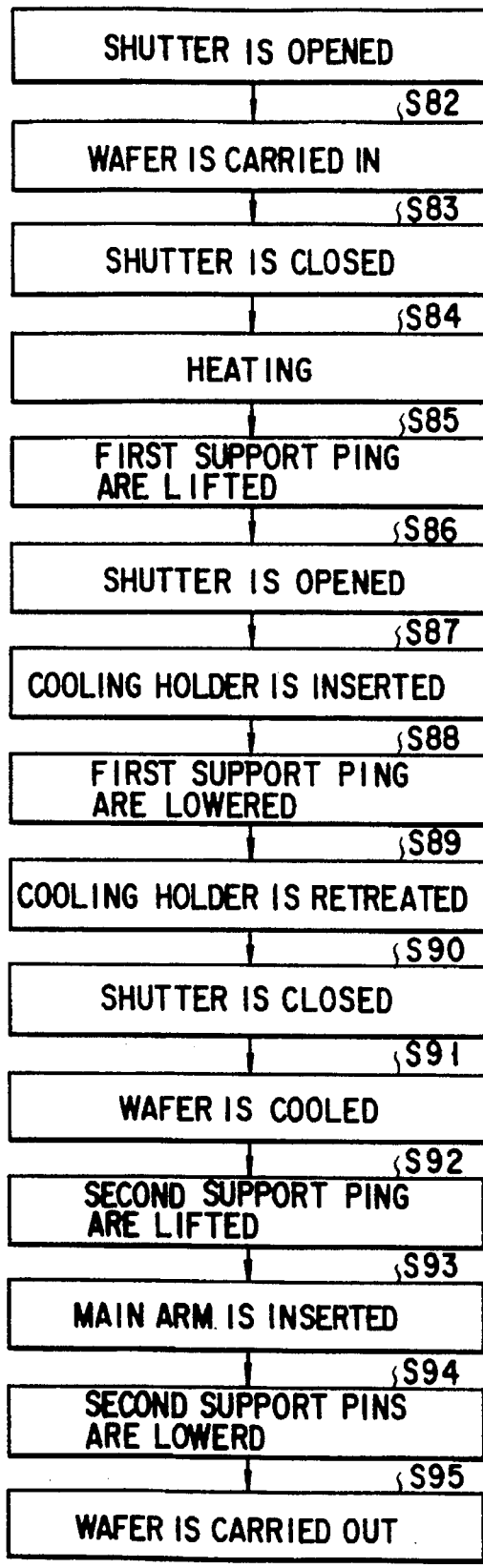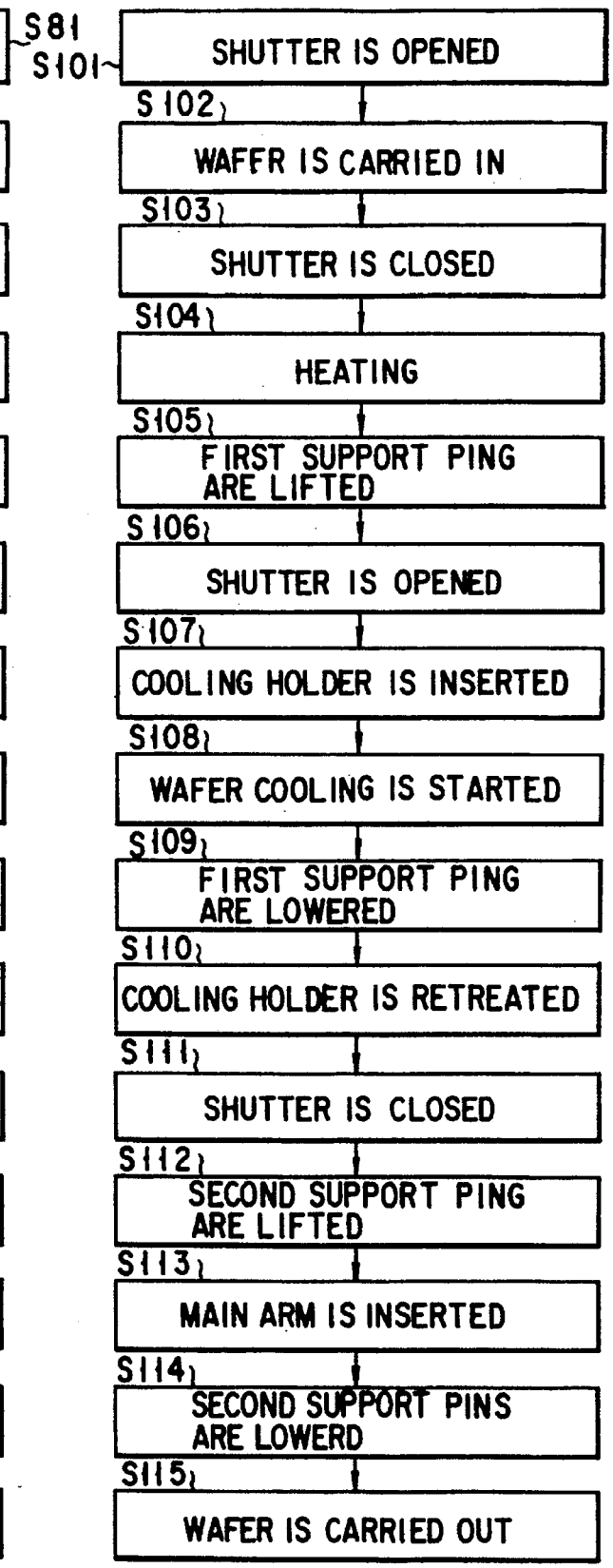
FIG. 20
FIG. 21

METHOD AND APPARATUS FOR HEAT-TREATING SUBSTRATE

BACKGROUND OF THE INVENTION

1. Field of the Invention

The present invention relates to method and apparatus for heating and cooling a substrate such as the semiconductor wafer.

2. Description of the Related Art

In the photolithography process for manufacturing semiconductor devices, the surface of a semiconductor wafer is cleaned, dried by heat, and cooled. It is then coated by photoresist, pre-baked, cooled, pattern-exposed, developed and post-baked. It is further baked (or baking step just before the developing step) between the pattern-exposing step and the developing step and then cooled.

For example, the wafer is pre-baked to a temperature of about 80° C. in a heating unit and it is post-baked to a temperature range of 50° C.–180° C. in other heating unit. After these baking steps, the wafer is cooled to room temperature (about 23° C.) in a cooling unit. In the photolithography process, therefore, it is heated and cooled repeatedly and several times.

However, the conventional cooling unit is located remote from the heating unit. The wafer must be therefore carried from the heating unit into the cooling one. While it is being carried in this manner, its temperature changes variously, thereby making temperature distribution in its plane non-uniform. As the result, resist film becomes uneven in thickness and developing irregularities are thus caused.

A heat-treating apparatus disclosed in Jpn. Pat. Appln. KOKAI Publication No. 6-29203 is well-known as means for preventing the wafer from changing its temperature like this while it is being carried. This heat-treating apparatus includes a heater of the non-contact type arranged in a baking unit at the upper portion thereof, a cooling plate also arranged in it at its lower portion, and pins moved up and down while supporting the wafer horizontal in it.

In the conventional heat-treating apparatus, however, it is arranged that the wafer is heated by the heater attached to such a position that is above the wafer and not contacted with it. It takes therefore a long time and a lot of heat energy to heat the wafer to a high temperature of 180° C., for example. In addition, it is difficult to make temperature distribution uniform in a plane of the wafer. Further, the heater and the cooling plate thermally interfere with each other because they are housed in the same unit.

Furthermore, the wafer is coated with chemically amplified resist, chemically-amplified resist changes its quality as time goes by after the wafer is post-baked. It must be therefore cooled for a short time after it is post-baked.

SUMMARY OF THE INVENTION

An object of the present invention is therefore to provide heat-treating method and apparatus capable of shortening the time during which a heated substrate can be cooled.

Another object of the present invention is to provide heat-treating method and apparatus capable of making temperature distribution uniform in a plane of the substrate.

A heat-treating method of heating and cooling a substrate according to the present invention comprises the steps of, (a) carrying the substrate into a heat-treating section by a main arm and mounting the substrate on a heating stage; (b) heating the substrate on the heating stage; (c) lifting the heated substrate from the heating stage; (d) approaching a cooling holder to the lifted substrate to cool the substrate above the heating stage; and (e) carrying-out the cooled substrate.

A resist-treating apparatus according to the present invention comprises a resist-treating apparatus provided with a heat-treating system unit for heating or cooling a substrate and a non-heat-treating system unit for neither heating nor cooling the substrate comprising; a main arm for carrying the substrate between the heat-treating system unit and the non-heat-treating system unit; a sub-arm for carrying the substrate in the heat-treating system unit and approaching the substrate to cool the substrate; a heating stage arranged in the heat-treating system unit to heat the substrate mounted thereon; a shutter arranged movable relative to the heating stage and serving to form a heat-treating space, enclosing the heating stage, when the substrate is to be heated, and communicate the heat-treating space with a waiting section when the substrate is not to be heated; and lifter means for lifting the substrate from the heating stage.

Another heat-treating apparatus according to the present invention comprises a heat-treating apparatus provided with a heat-treating section and a waiting section for heating and cooling a substrate comprising; a main arm for carrying the substrate into the heat-treating section; an approach cooling holder arranged movable at the waiting section and serving to approach the substrate to cool and carry the substrate; a heating stage arranged at the heat-treating section and serving to heat the substrate mounted thereon; a shutter arranged movable relative to the heating stage and serving to enclose the heating stage to form a heat-treating space when the substrate is to be heated and communicate the heat-treating space with the waiting section when the substrate is not to be heated; and lifter means for lifting the substrate from the heating stage.

The position at which the substrate is cooled may be just above the heating means (or substrate-heating stage) or remote from the area just above the heating means.

Peltier elements, the heat exchanger system in which isothermal water is circulated, or the gas cooling system in which cooling gas is used may be used as the cooling means.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 3 is a perspective view showing a heating stage and a cooling holder dismantled;

FIG. 5 is a plan view showing the cooling holder;

FIG. 6 is a sectional view showing a part of the cooling holder;

FIG. 10 is a flow chart showing the heat-treating method according to another embodiment of the present invention;

FIG. 20 is a flow chart showing the heat-treating method according to a still further embodiment of the present invention; and FIG. 21 is a flow chart showing the heat-treating method according to a still further embodiment of the present invention.

DESCRIPTION OF THE PREFERRED EMBODIMENTS

Some preferred embodiments of the present invention will be described with reference to the accompanying drawings.

Figure 1:
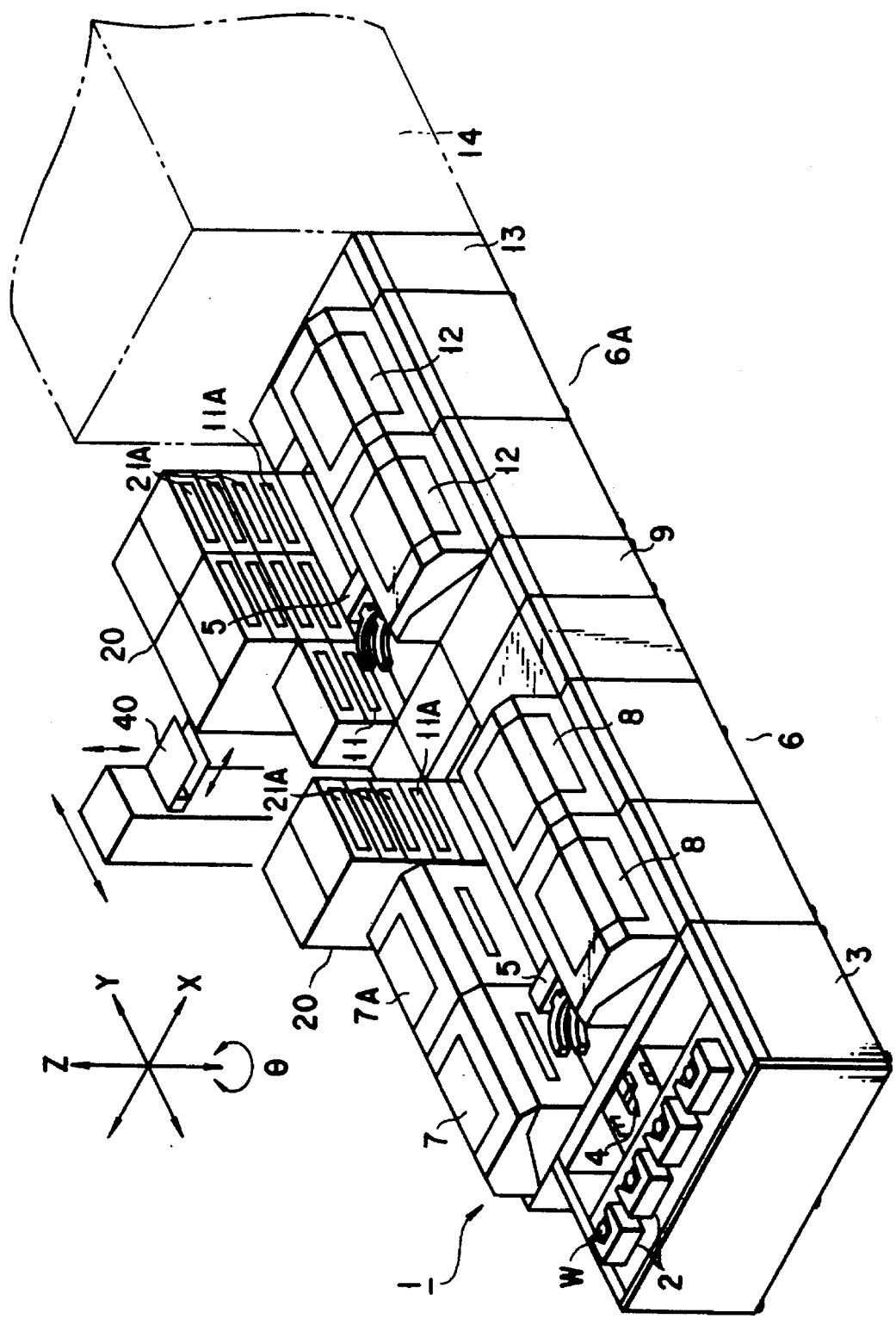
FIG. 1 is a perspective view showing the resist coating/developing system.

As shown in FIG. 1, a resist coating and developing system 1 includes a cassette station 3, first and second process sections 6 and 6A, and interface sections 9 and 13. The cassette station 3 is arranged on the front side of the system 1, including a table on which plural wafer cassettes 2 are mounted. It also includes an auxiliary arm 4 for carrying a wafer W into and out of the system 1. The auxiliary arm 4 can move along the table which extends in the direction of an axis X. 25 sheets of semiconductor wafers W are housed in each of the wafer cassettes 2.

The first process section 6 includes various kinds of process unit 7, 7A, 8 and 20 which are needed to carry out the resist coating and developing process. It is connected to the second process section 6A via the interface section 9. The second process section 6A also includes various kinds of process unit 10, 11, 12 and 20 which are needed to carry out the resist coating and developing process. It is connected to an exposing section 14 through the interface section 13.

Each of first and second process sections 6 and 6A has a center passage extending in it in the direction of an axis Y. A main arm 5 is arranged movable along the center passage to carry the wafer W. Responsive to commands applied from a controller 100, the main arm 5 can move in the directions of axes X, Y and Z and rotate round the axis Z by e. Each of the process units 7, 7A, 8, 10, 11, 12 and 20 is opened on its side which faces the center passage. The main arm 5 carries the wafer W into and out of each process unit through the open side.

At the first process section 6: the process unit 7 has a brush scrubber for cleaning the wafer W; the process unit 7A has a high pressure jet water cleaner for washing and cleaning the wafer W by high pressure jet water; two heat process units 20, piled one upon the other, have heat plates for heating the wafer W. They are arranged along the center passage on one side thereof, while two developing units 8 are arranged side by side along the center passage on the other side thereof.

At the second process section 6A: the process unit 10 includes an adhesion process unit for applying hydrophobic process to the wafer W before it is coated with photoresist; a cleaning unit 11 is arranged under the adhesion unit 10 and it has a means for cooling the wafer W; two heating units 20 are arranged side by side and next to the adhesion and cleaning units 10 and 11. They are all arranged along the center passage on one side thereof, while two resist coating units 12, each having a spin coater for coating the wafer W with resist while rotating it, are arranged side by side along the center passage on the other side thereof.

Referring to FIGS. 2 through 7, the heat-treating apparatus according to a first embodiment of the present invention will be described in detail.

Figure 2:
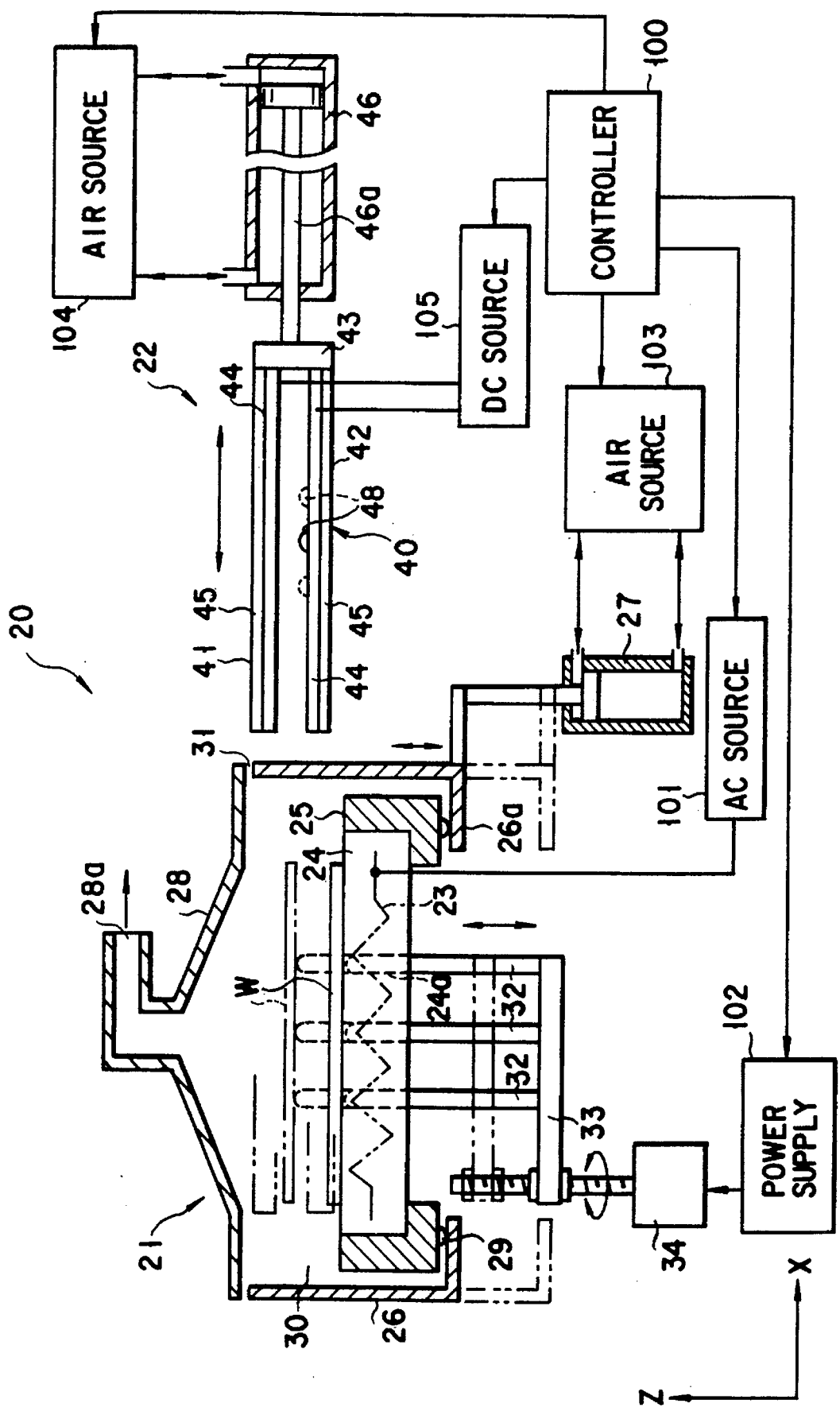
FIG. 2 is a block diagram showing the heat-treating apparatus according to an embodiment of the present invention.

As shown in FIG. 2, the heat-treating apparatus 20 has a heat process section 21 and a waiting section 22. The wafer W is heated at the heat process section 21 and cooled to room temperature (or about 23° C.) at the waiting section 22. A wafer-mounted stage 24 in which a heater 23 is embedded is arranged in a chamber 30 at the heat process section 21. The chamber 30 comprises substantially an upper cover 28 and a shutter 26. An AC power source 101 is connected to the heating heater 23. The wafer-mounted stage 24 is supported by a frame 21a through a member 25.

The cylindrical shutter 26 encloses the wafer-mounted stage 24. It is connected to a rod of an air cylinder 27. It is moved up and doom when air is supplied from an air supply source 103 into the cylinder 27. The wafer W can be carried into the chamber 30 through an opening which is formed when it is moved down.

The cover 28 is arranged above the wafer-mounted stage 24. An opening is formed in the center of the cover 28 and it is communicated with an exhaust unit (not shown) through a passage 28a. A power switch (not shown) for the exhaust unit is connected to an output side of the controller 100.

A flange 26a projects inward from the bottom end of the shutter 26, facing the underside of the wafer-mounted stage 24. A seal packing 29 is attached to the underside of the stage support 25. When the shutter 26 is lifted, the flange 26a is struck against the seal packing 29, thereby keeping the chamber 30 substantially air-tight. When it is closed like this, it may be arranged that a clearance 31, about 1 mm wide, is formed between the cover 28 and it and that air is introduced into the chamber 30 through the clearance 31 and exhausted outside the chamber 30 through the exhaust passage 28a. When this air current is formed above the wafer W, the heat insulation of the wafer W from wafer surrounding members can be promoted, thereby enabling wafer temperature to be made uniform. Although the lifter mechanism 27 has been provided to move the shutter 26 up and down in this example, another one may be added to move the cover 28 and/or the wafer-mounted stage 24 up and down.

The wafer W can be carried into and out of the chamber 30 through a ring-shaped clearance which is formed between the shutter 26 and the cover 28 when the shutter 26 is opened. This ring-shaped clearance thus formed enables the wafer W to be carried in and out of the chamber 30 from all round as well as from the waiting section 22.

As shown in FIGS. 2 and 3, three support pins 32 are arranged just under the wafer mounted stage 24. They are erected from a lifting plate 33 of a lifter mechanism 34. A ball nut is attached to the lifting plate 33 at an end thereof and a ball screw is screwed into the ball nut. A power source 102 for the lifter mechanism 34 is connected to the output side of the controller 100.

Three through-holes 24a are formed in the wafer-mounted stage 24. When three support pins 32 are lifted by the lifter mechanism 34, they are projected upward from the top of the stage 24, passing through the through-holes 24a. They are made of heat insulating material such as ceramics, resin of the fluorine group, and synthetic rubber.

Figure 4:
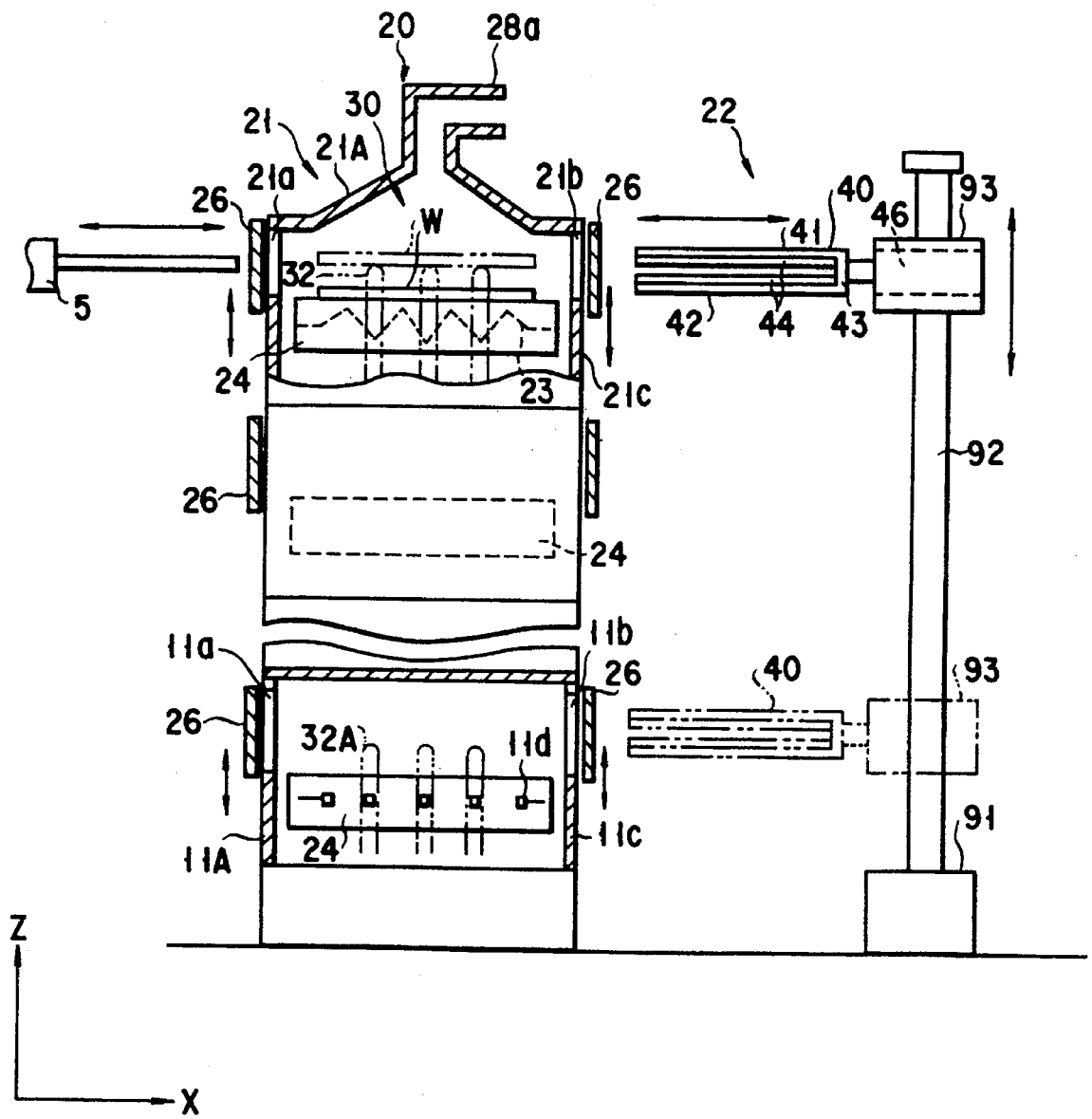
FIG. 4 is a vertically-sectioned view showing the heat-treating apparatus.

As shown in FIGS. 1 and 4, the heat-treating apparatus 20 has three heating units 21 and one cooling unit 11A, which are piled one upon the others. The main arm 5 can approach each of these units from one side thereof while the sub-arm 40 from the other side thereof. The sub-arm 40 has Peltier elements 44 to cool the wafer W and it serves as a cooling holder. A coolant passage 11d is formed in the wafer-mounted stage 24 in the cooling unit 11A.

As shown in FIG. 4, the sub-arm 40 is supported at the waiting section 22, movable in the direction of the axis Z by a lifter mechanism 91, which has a vertical screw 92 and a nut 93. The sub-arm 40 is connected to the nut 93. A power switch for the lifter mechanism 91 is connected to the controller 100.

As shown in FIG. 2, the sub-arm (or cooling holder) 40 is connected to a rod 46a of an air cylinder 46, movable from the waiting section 22 to the heat-treating section 21 in the direction of the axis X. The air cylinder 46 is communicated with an air supply source 104 which is controlled by the controller 100.

The cooling holder 40 includes upper and lower members 41 and 42 and a connecting member 43. The upper and lower members 41 and 42 are connected parallel to each other by the connecting member 43, with a certain interval or space, into which the wafer W can be inserted, interposed between them. Peltier elements 44 are embedded in the inner faces of the upper and lower members 41 and 42, while radiator plates 45 are attached to the outer faces thereof. A power source 105 for Peltier elements 44 is connected to the controller 100. Cooling means used for the cooling holder 40 is not limited to Peltier elements. It may be arranged, for example, that an internal passage is formed in the cooling holder 40 and that coolant such as cooling water and nitrogen gas is circulated through the internal passage.

As shown in FIG. 3, three slits 47 are formed in the lower member 42 not to cause the cooling holder 40 to interfere with the support pins 32.

As shown in FIGS. 5 and 6, plural spacers 48 are attached to the cooling holder 40 to support the wafer w. The spacer 48 comprises a larger-diameter ring 48a and a smaller-diameter ring 48b coaxially fixed to the top of the lower member 42 by a screw 48c. This enables that area of the wafer W which is contacted with the cooling holder 40 to be made smaller, so that temperature distribution can be made uniform in a plane of the wafer W. In addition, the cooling face 42 of the cooling holder 40 can come nearer to the wafer W, thereby enabling cooling effect attained by radiation to be increased to a greater extent.

Figure 7:
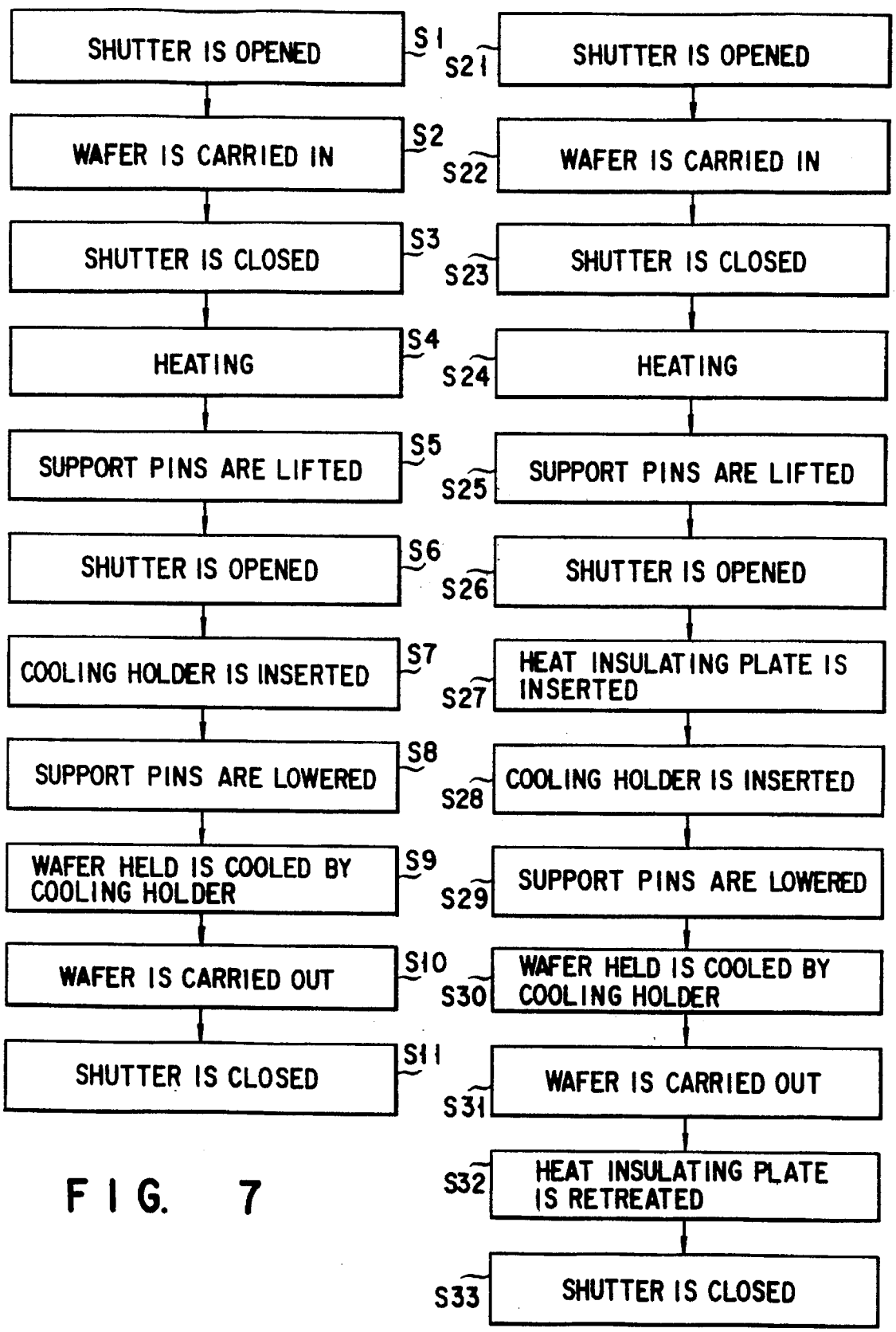
FIG. 7 is a flow chart showing the heat-treating method according to an embodiment of the present invention.

The heat-treating method according to a first embodiment of the present invention will be described, referring to FIGS. 7 and 2.

The wafer W is resist-coated in the coating unit 12 and carried from the coating unit 12 into the heat-treating unit 20 by the main arm 5. The shutter 26 is opened (step S1) and the wafer W is carried together with the main arm 5 into the heat-treating unit 20 (step S2). The support pins 32 are lifted and the wafer W is transferred from the main arm 5 onto the support pins 32. The main arm 5 is retreated from the heat-treating unit 20 and the shutter 26 is closed (step S3). The support pins 32 are lowered to mount the wafer W on the wafer-mounted stage 24 and the wafer W is heated to an intended temperature (step S4). The baking temperature of the wafer W is in a range of 50° C.–180° C., for example.

After the heating is finished, the chamber 30 is exhausted while lifting the support pins 32 to lift the wafer W from the stage 24 (step S5). The shutter 26 is opened (step S6) and the rod 46a advances forward from the cylinder 46 to move the cooling holder 40 from the waiting section 22 into the heat-treating section 21 or into the chamber 30 (step S7). The wafer W is thus enclosed by the cooling holder 40. The support pins 32 are lowered to transfer the wafer W from them to the cooling holder 40 (step S8). It is thus supported by the cooling holder 40, partially contacting each of the plural spacers 48.

Upper Peltier elements 44 are faced the top surface of the wafer W while lower ones the underside thereof. Current is supplied to the upper and lower Peltier elements 44 and the wafer W is cooled by the cooling holder 40 (step S9). The wafer W can be thus cooled from above and below at the same time. The rod 46a is then retreated into the cylinder 46 to carry the wafer W out of the chamber 30 while holding it in the cooling holder 40 (step S10). After the wafer W is carried out like this, the shutter 26 is closed (step S11)

Figure 8:
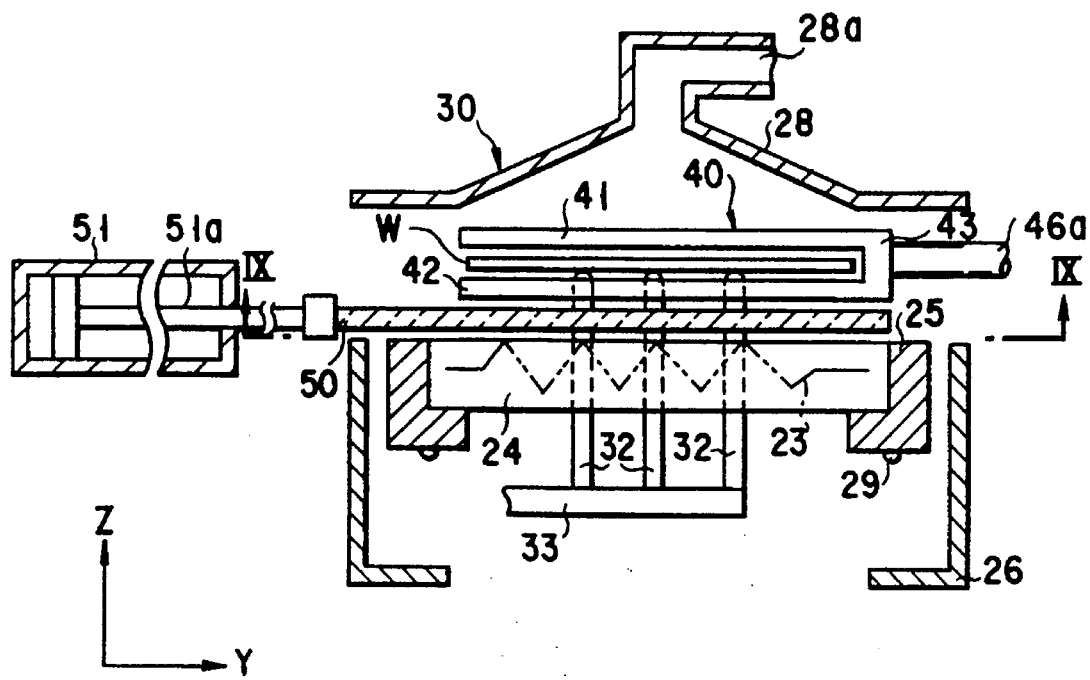
FIG. 8 is a block diagram showing the heat-treating apparatus according to another embodiment of the present invention.
Figure 9:
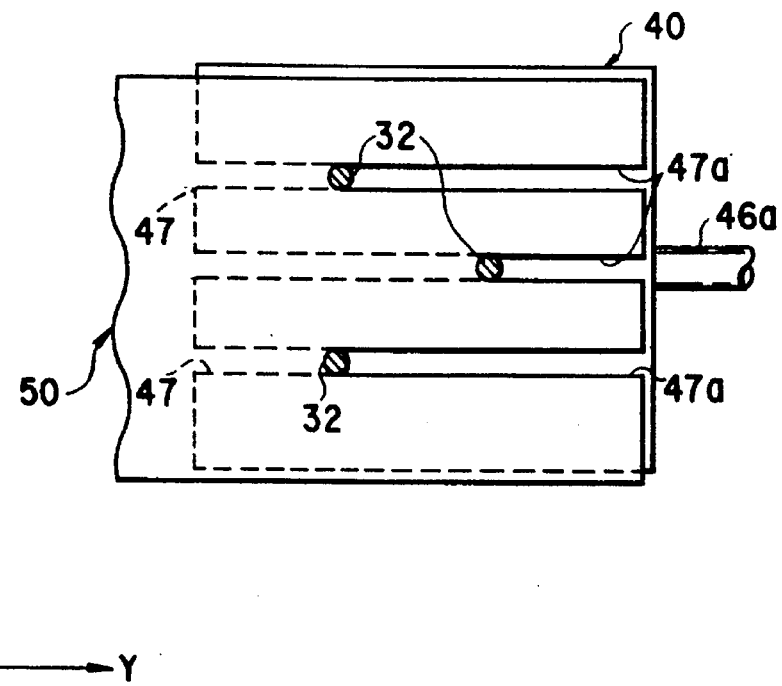
FIG. 9 is a sectional view taken along a line IX—IX in FIG. 8.

The heat-treating apparatus according to a second embodiment of the present invention will be described, referring to FIGS. 8 and 9. Same components as those in the first embodiment will be described only when needed.

The second heat-treating apparatus further includes a heat insulating plate 50, which is connected to a rod 51a of a cylinder 51 and inserted into the chamber 30 by the cylinder 51. The heat insulating plate 50 thus inserted is positioned between the wafer-mounted stage 24 and the cooling holder 40. It may be held waiting at a position in opposite to, on same side as or perpendicular to the cooling holder 40. It has three slits 47a, as shown in FIG. 9, not to cause it to interfere with three support pins 32.

The heat-treating method according to a second embodiment of the present invention will be described with reference to FIGS. 8 through 10.

The wafer W is resist-coated in the coating unit 12 and carried from the unit 12 into the heat-treating unit 20 by the main arm 5. In short, the shutter 26 is opened (step S21) and the wafer W is carried together with the main arm 5 into the heat-treating unit 20 (step S22). The support pins 32 are lifted to transfer the wafer W from the main arm 5 onto them.

The main arm 5 is retreated from the heat-treating unit 20 and the shutter 26 is closed (step S23). The support pins 32 are lowered to mount the wafer W on the wafer-mounted stage 24, which is then heated there to an intended temperature (step S24).

After this heating is finished, the exhausting of the chamber 30 is started while the support pins 32 are lifted to lift the wafer W from the stage 24 (step S25). The shutter 26 is opened (step S26) and the heat insulating plate 50 is inserted into the chamber 30 (step S27). It is positioned between the cooling holder 40 and the stage 24 to shield heat radiated from the stage 24. The rod 45a advances forward from the cylinder 46 to move the cooling holder 40 from the waiting section 22 into the heat-treating section 21 or chamber 30 (step S28). The wafer W is thus enclosed by the cooling holder 40. The support pins 32 are lowered to transfer the wafer W from them to the cooling holder 40 (step S29). The wafer W is supported by the cooling holder 40, partly contacting each of the plural spacers 48.

Upper Peltier elements 44 are faced the top surface of the wafer W while lower ones the bottom surface thereof. Current is supplied to the upper and lower Peltier elements 44 to start the cooling of the wafer W through the cooling holder 40 (step S30). The wafer W can be thus cooled from above and below at the same time. The rod 46a is retreated into the cylinder 46 to carry the wafer W out of the chamber 30 while holding it by the cooling holder 40 (step S31). After the wafer W is carried out like this, the heat insulating plate 50 is retreated from the chamber 30 (step S32) and the shutter 26 is closed (step S33).

According to the above-described second embodiment, the cooling holder 40 is heat-insulated from the wafer-heating stage 24 by the heat insulating plate 50. Therefore, the wafer W can be more quickly lowered in temperature and its both surfaces can be more uniformly cooled.

Figure 11:
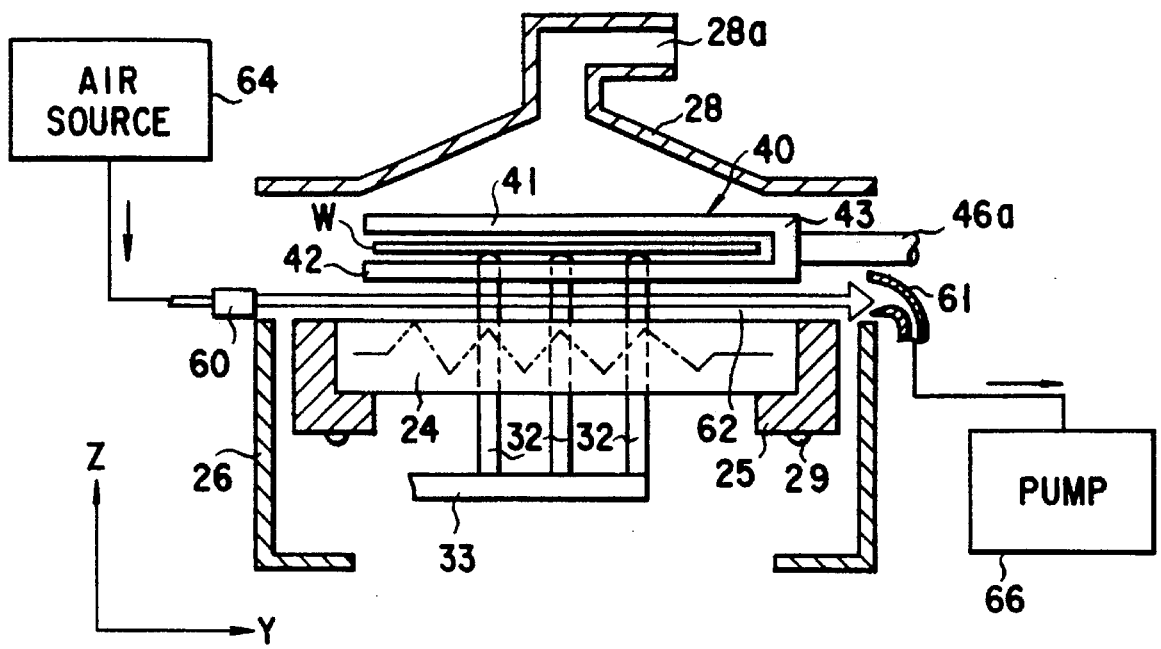
FIG. 11 is a block diagram showing the heat-treating apparatus according to a further embodiment of the present invention.

The heat-treating apparatus according to a third embodiment of the present invention will be described with reference to FIGS. 11 and 12. Same components as those in the first embodiment will be described only when needed.

The third heat-treating apparatus further includes a jetting nozzle 60 for forming a heat insulating air layer 62, and a suction pipe 61. The jetting nozzle 60 is communicated with an air supply source 64. The suction pipe 61 is communicated with the pumping side of a pump 66. A power switch for the air supply source 64 and the pump 66 is connected to the controller 100.

Figure 12:
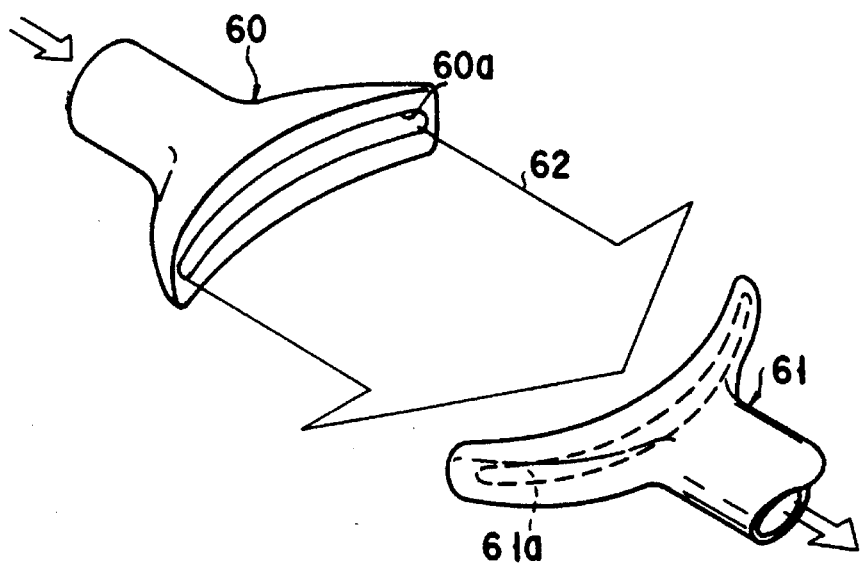
FIG. 12 is a perspective view showing a part of means for forming a layer of heat insulating air.

As shown in FIG. 12, the nozzle 60 has a wide jetting opening 60a and the suction pipe 61 has also a wide suction opening 61a. When air is jetted through the nozzle 60 and sucked through the suction pipe 61, a wide layer 62 of heat insulating air can be formed. This heat insulating air layer 62 is formed between the cooling holder 40 and the wafer-heating stage 24. Air jetted through the nozzle 60 has a temperature same as or lower than room temperature.

Figures 13, 16:
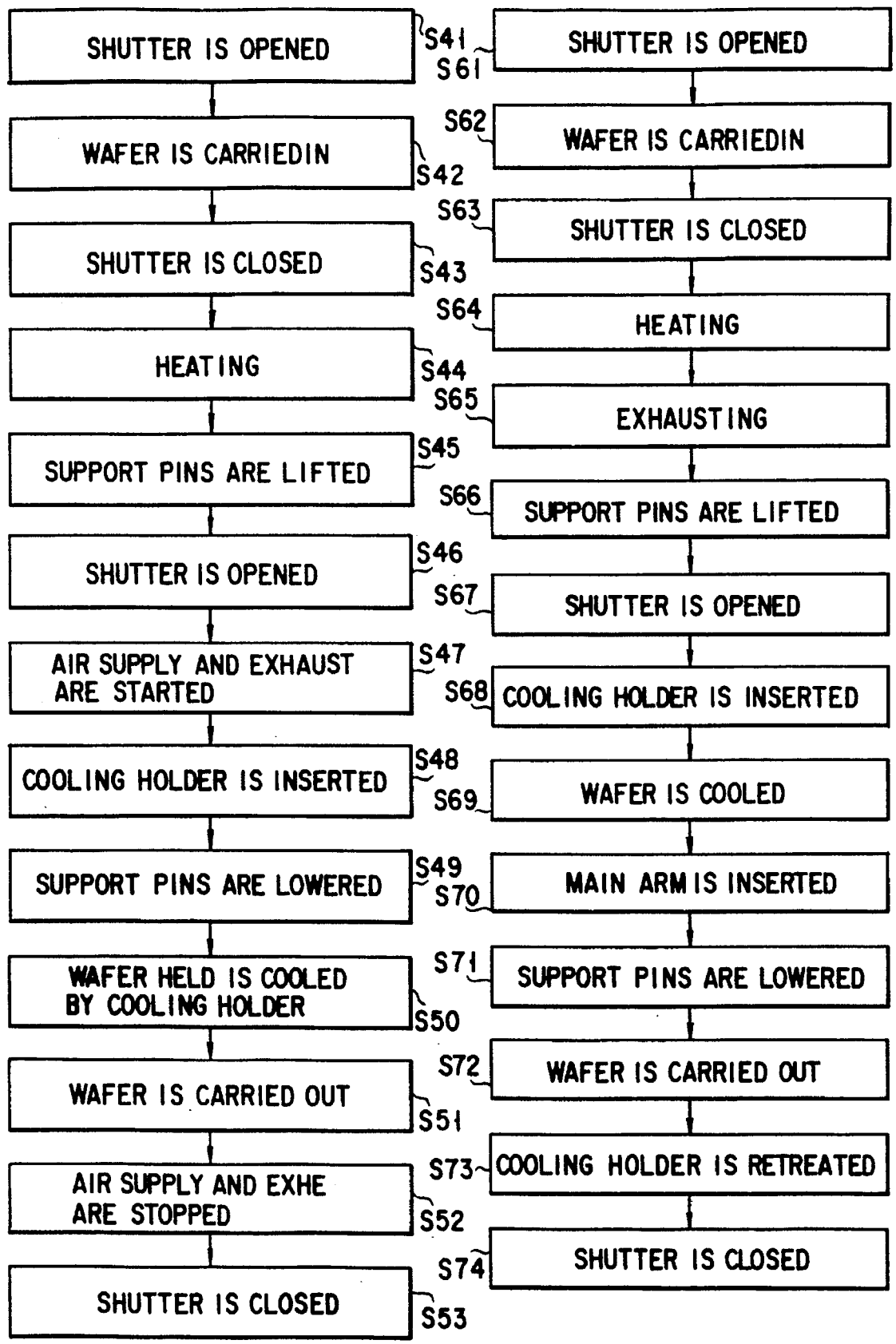
FIG. 13 is a flow chart showing the heat-treating method according to a further embodiment of the present invention.
FIG. 16 is a flow chart showing the heat-treating method according to a still further embodiment of the present invention.
Figure 14:
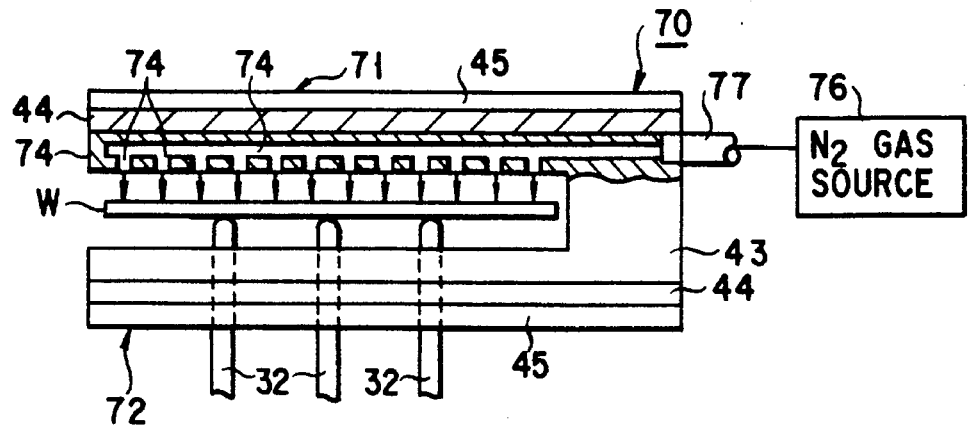
FIG. 14 is a block diagram showing a part of the cooling holder cut away.

The heat-treating method according to a third embodiment of the present invention will be described with reference to FIGS. 13 and 14.

The wafer W is resist-coated in the coating unit 12 and carried from the unit 12 into the heat-treating unit 20 by the main arm 5. Namely, the shutter 26 is opened (step S41) and the wafer W is carried together with the main arm 5 into the heat-treating unit 20 (step S42). The support pins 32 are lifted to transfer the wafer W from the main arm 5 to them. The main arm 5 is retreated from the heat-treating unit 20 and the shutter 26 is closed (step S43). The support pins 32 are lowered to mount the wafer W on the stage 24 and the wafer W is heated there to an intended temperature (step S44).

After this heating is finished, the support pins 32 are moved up to lift the wafer W from the stage 24, while exhausting the chamber 30 (step S45). The shutter 26 is opened (step S46) and air is jetted through the nozzle 60 and sucked through the suction pipe 61 to thereby form the heat insulating air layer 62 (step S47). The heat insulating air layer 62 is positioned between the wafer W and the stage 24 to shield heat radiated from the stage 24.

The cylinder 45 pushes its rod 46a to move the cooling holder 40 from the waiting section 22 into the heat-treating section 21 or chamber 30 (step S48). The wafer W is thus enclosed by the cooling holder 40. The support pins 32 are lowered to transfer the wafer W from them to the cooling holder 40 (step S49). The wafer W is supported by the cooling holder 40, partly contacting each of the plural spacers 48.

Upper Peltier elements 44 are faced the top surface of the wafer W while lower ones the bottom surface thereof. Current is supplied to the upper and lower Peltier elements 44 to cause the cooling holder 40 to start its cooling to the wafer W (step S50). The wafer W can be thus cooled from above and below at the same time. The rod 46a is retreated into the cylinder 46 to carry the wafer W from the chamber 30 while holding it by the cooling holder 40 (step S51). After the wafer W is carried out like this, air jetting through the nozzle and air sucking through the suction pipe 61 are stopped (step S52) and the shutter 26 is closed (step S53).

According to the above-described third embodiment, heat can be prevented from transmitting from the stage 24 to the cooling holder 40 by the heat insulating air layer 62. To add more, the temperature of the stage 24 is lowered by the heat insulating air layer 62. When a next wafer W is to be heat-treated, therefore, it is desirable that the next wafer is carried onto the stage 24 after the temperature of the stage 24 reaches a predetermined one.

The heat-treating apparatus according to a fourth embodiment of the present invention will be described, referring to FIG. 14. Same components as those in the first embodiment will be described only when needed.

The fourth heat-treating apparatus further includes a cooling holder 70 provided with gas jetting function. An internal passage 74a is formed in an upper plate member 71 of the cooling holder 70. It is arranged at a position lower than Peltier elements 44 and connected to a gas supply source 76 through a pipe 77. The gas supply source 76 contains $N_2$ gas having room temperature or cooled lower. Its power switch is connected to the controller 100. The internal passage 74a is communicated with a plurality of jetting holes 74b which are opened in the underside of the upper plate member 71.

Although the gas jetting mechanism has been added to the upper plate member 71 in this fourth example, it may be arranged in a lower plate member 72. Clean air and other non-oxidizing gases may be used instead of $N_2$ gas.

The heat-treating method according to a fourth embodiment of the present invention will be described with reference to FIG. 16.

Steps S61–S64 are substantially same as steps S41–S44 in the third embodiment.

After the heating of the wafer W is finished, the exhausting of the chamber 30 is started (step S65). The support pins 32 are lifted to lift the wafer W from the stage 24 (step S66). The shutter 26 is opened (step S67) and the cooling holder 70 is moved from the waiting section 22 into the heat-treating section 21 or chamber 30 (step S68). The wafer W is thus enclosed by the cooling holder 70 without contacting it.

$N_2$ gas is supplied from the gas supply source 76 to the cooling holder 70 to blow $N_2$ gas to the wafer W. The chamber 30 is thus filled with $N_2$ gas. After $N_2$ gas is purged, current is supplied to the Peltier elements 44 to cool the wafer W by the cooling holder 70 (step S69).

The main arm 5 is inserted into the chamber 30 (step S70). The support pins 32 are lowered to transfer the wafer W from them to the main arm 5 (step S71). The wafer W is then carried out of the chamber 30 (step S72). After the wafer W is carried out like this, the supply of $N_2$ gas into the chamber 30 is stopped, the cooling holder 70 is retreated from the chamber 30 (step S73) and the shutter 26 is closed (step S74).

According to the above-described fourth embodiment, high temperature atmosphere can be replaced by low temperature inactive gas atmosphere while supplying $N_2$ gas to the wafer W, before the cooling of the wafer W is started. Cooling and temperature-adjusting of the wafer W can be thus attained while keeping the wafer surface previously in a same low temperature atmosphere. Temperature distribution can be therefore made much more uniform in a plane of the wafer W. In addition, the cooling of the wafer W can be promoted by $N_2$ gas flow jetted, thereby making the heat-treating time shorter.

Figure 15A:
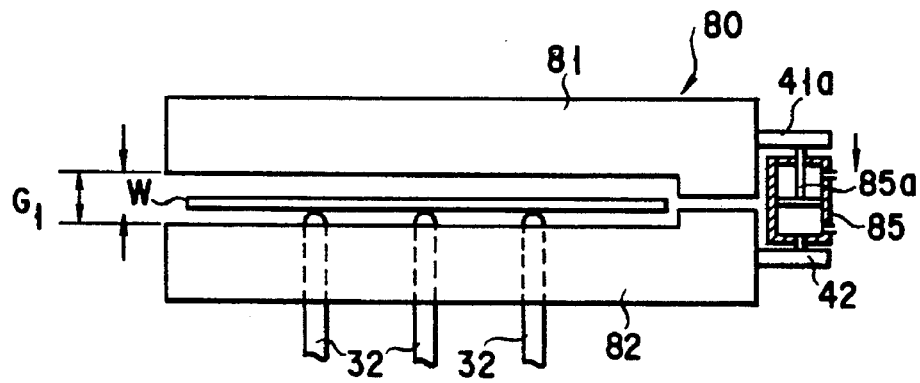
FIGS. 15A and 15B are block diagrams showing a part of each cooling holder cut away.
Figure 15B:
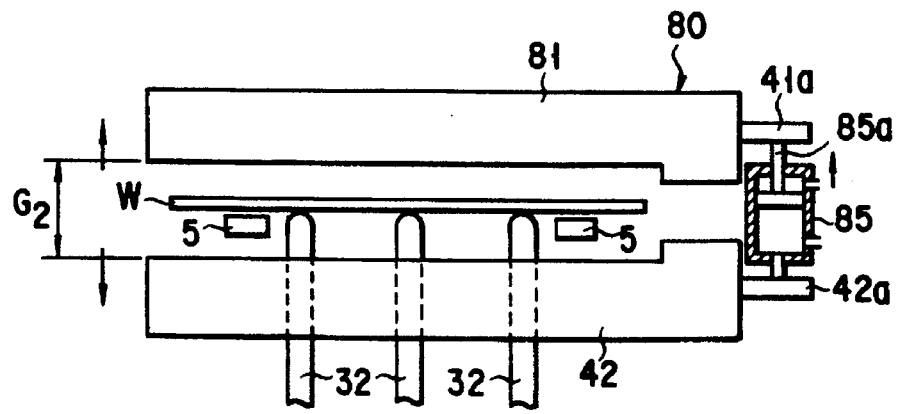

The heat-treating apparatus according to a fifth embodiment of the present invention will be described, referring to FIGS. 15A and 15B. Same components as those in the first embodiment will be described only when needed.

The fifth heat-treating apparatus further includes a cooling holder 80 which can change the interval between its cooling faces. An upper plate member 81 of the cooling holder 80 is separated from and made independent of a lower plate member 82 thereof. In short, the upper plate member 81 is connected to a rod 85a through a bracket 41a while the lower one 82 to a cylinder 85 through another bracket 42a. The cylinder 85 is communicated with an air supply source (not shown), which is controlled by the controller 100. When air is supplied from the air supply source into the cylinder 85, the upper plate member 81 comes nearer to the lower one 82, as shown in FIG. 15A, and it comes remoter from the lower one, as shown in FIG. 15B. A ball screw mechanism may be used, as the interval changing means, instead of the air cylinder 85.

The heat-treating method according to a fifth embodiment of the present invention will be described with reference to FIG. 16.

Steps S61–S67 are substantially same as those in the above-described fourth embodiment. As shown in FIG. 15A, the cooling holder 80 having an interval $G_1$ between the upper 81 and the lower plate member 82 is inserted into the chamber 30 (step S68). The wafer W is thus enclosed by the cooling holder 80, not contacting it. Upper Peltier elements 81a are faced the top surface of the wafer W while lower ones 82a the bottom surface thereof. Current is supplied to the upper and lower Peltier elements 81a and 82a to cool the wafer W through the cooling holder 80 (step S69). The wafer W can be thus cooled from above and below at the same time.

Air is then supplied to the cylinder 85 to set an interval $G_2$ between the upper 81 and the lower plate member 82. The interval $G_2$ is set to be larger than the interval $G_1$, so that the transferring of the wafer W between the main arm 5 and the sub-arm 80 can be made easier. It is preferable that the intervals $G_1$ and $G_2$ are set to be 10–20 mm and 25–55 mm in the case of 6-inch wafer and that they are set to be 10–20 mm and 30–60 mm in the case of 8-inch wafer.

The main arm 5 is inserted into the chamber 30 (step S70). The support pins 32 are lowered to transfer the wafer W from them to the main arm 5 (step S71). The wafer W is carried out of the chamber 30 (step S72). After the wafer W is carried out like this, the cooling holder 80 is retreated from the chamber 30 (step S73) and the shutter 26 is closed (step S74).

According to the above-described fifth embodiment, cooling faces of the cooling holder 80 can be brought nearer to the wafer W, when the wafer W is to be cooled, thereby making cooling efficiency higher. They can also be brought remoter from the wafer W, when the wafer W is not to be cooled, thereby enabling the transferring of the wafer W between the main 5 and the sub-arm 80 to be made easier.

Referring to FIGS. 17A–17C, 18 and 19, the heat-treating apparatus according to a sixth embodiment of the present invention will be described. Same components as those in the first embodiment will be described only when needed.

The sixth heat-treating apparatus further includes a lifter mechanism provided with second support pins 32a. This lifter mechanism provided with second support pins 32a is arranged at the waiting section 22. The second three support pins 32a are erected from a lifting plate 33a of a lifter mechanism 34a. When this second lifter mechanism is used, cooling and temperature-adjusting of the wafer W can be attained at any position including the above of the stage 24 and the wafer W can be transferred from the sub-arm (or cooling holder) 40 to the main arm 5 at the waiting section 22.

The heat-treating method according to a sixth embodiment of the present invention will be described with reference to FIG. 20.

Figure 17A:
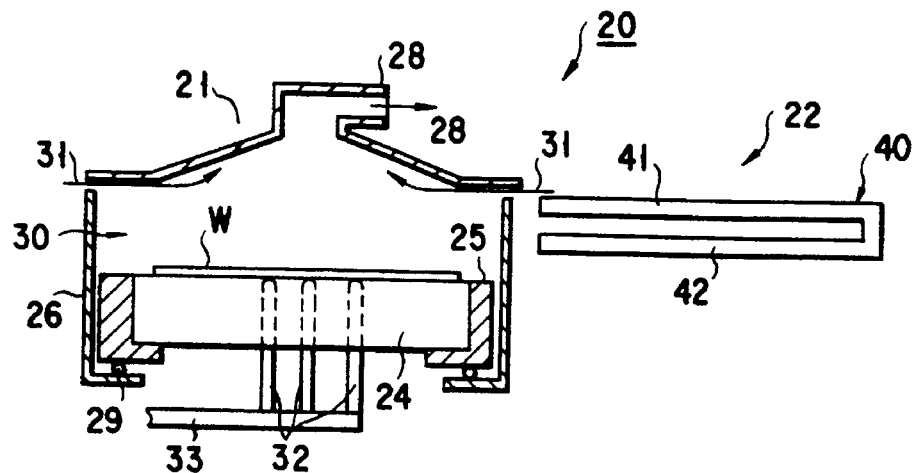
FIGS. 17A, 17B and 17C are vertically-sectioned views showing the heat-treating apparatus intended to explain the heat-treating method.
Figure 17B:
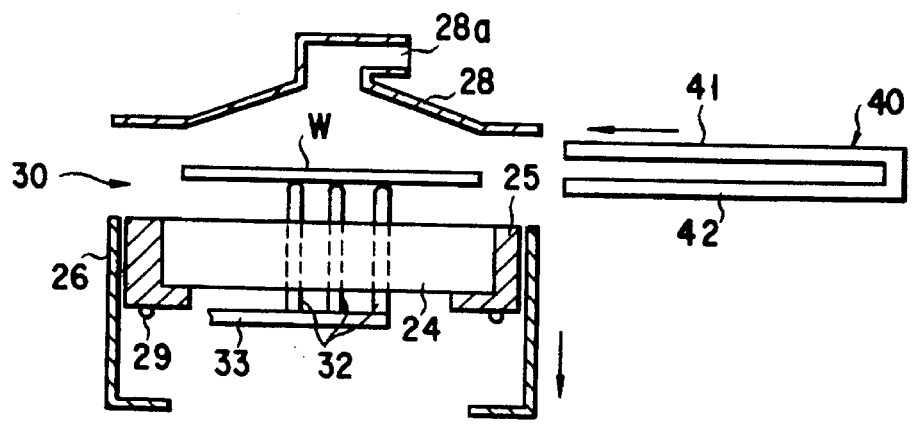
Figure 17C:
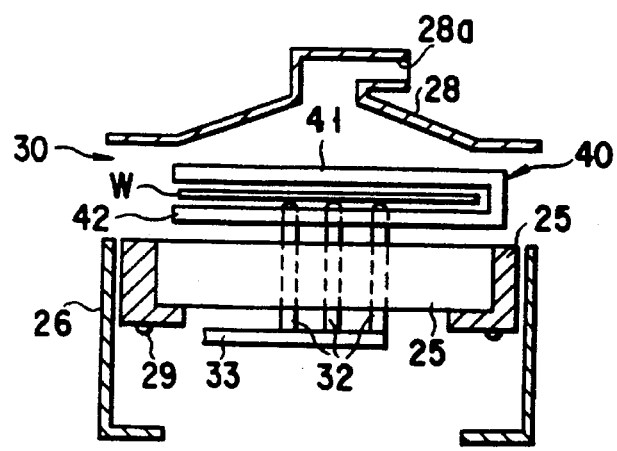

Steps S81–S84 are substantially same as steps S61–S64 in the fifth embodiment. The exhausting of the chamber 30 is started after the wafer W is heated, as shown in FIG. 17A. As shown in FIG. 17B, first support pins 32 are lifted to lift the wafer W from the stage 24 (step S85). As shown in FIG. 17C, the shutter 26 is opened (step S86) and a rod 46a is projected from the cylinder 46 to move the cooling holder 40 from the waiting section 22 into the heat-treating section 21 or chamber 30 (step S87).

The first support pins 3 are lowered (step S88). The wafer W is thus transferred from, the first support pins 32 to the cooling holder 40 and it is supported by a spacer 48 of the lower plate member 42. Upper Peltier elements 44a are faced the top surface of the wafer W in the cooling holder 40 while lower ones 44b the bottom surface thereof.

The cooling holder 40 is then retreated from the chamber 30 while holding the wafer W (step S89). After the cooling holder 40 is moved from the heat-treating section 21 to the waiting section 22, the shutter 26 is closed (step S90). Current is supplied to upper and lower Peltier elements 44a and 44b to cool the wafer W (step S91). The wafer w can be thus cooled from above and below at the same time. The wafer W is cooled to room temperature (or about 23° C.) at the waiting section 22.

Figure 18:
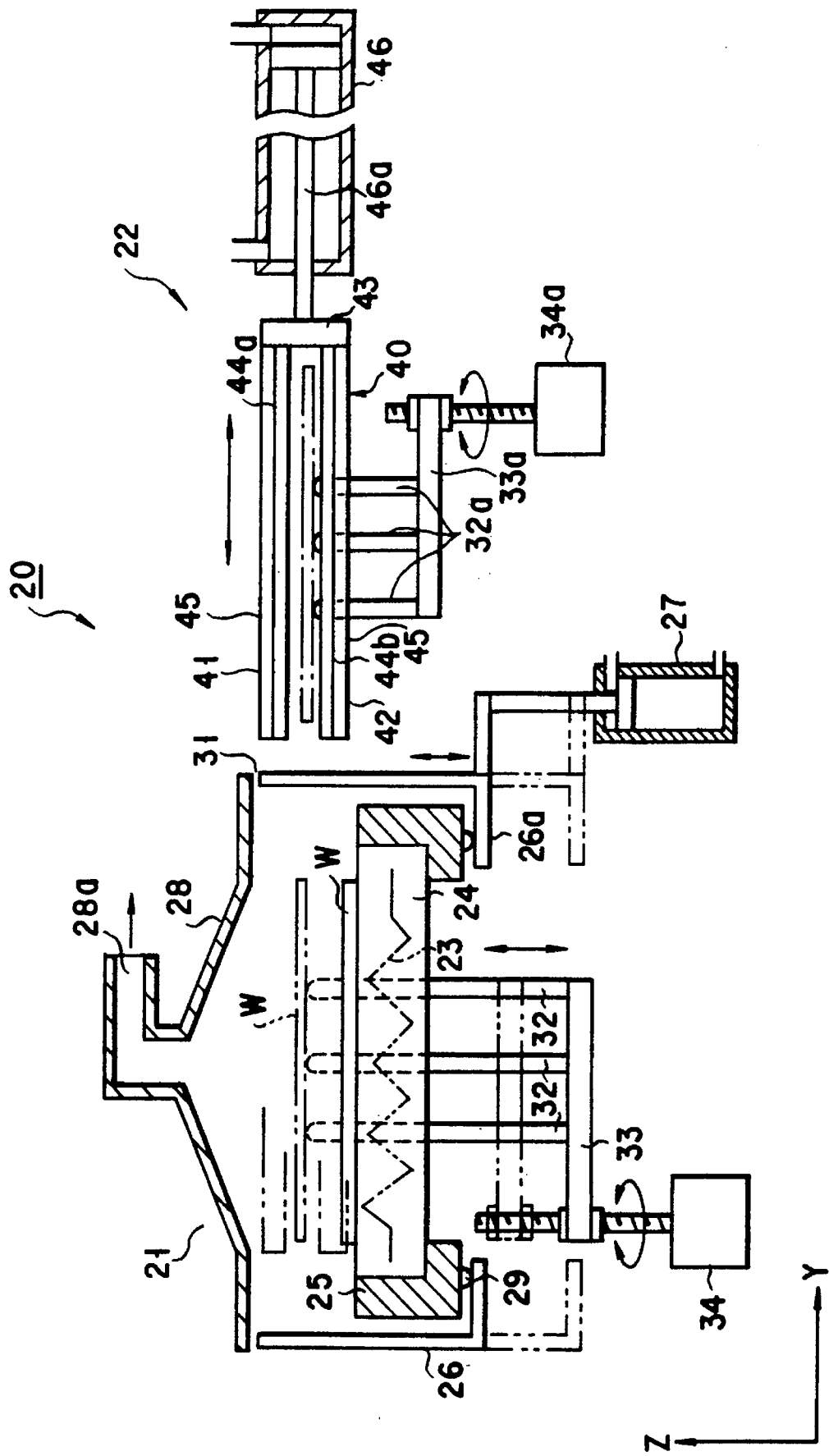
FIG. 18 is a block diagram showing the heat-treating apparatus according to a still further embodiment of the present invention.
Figure 19:
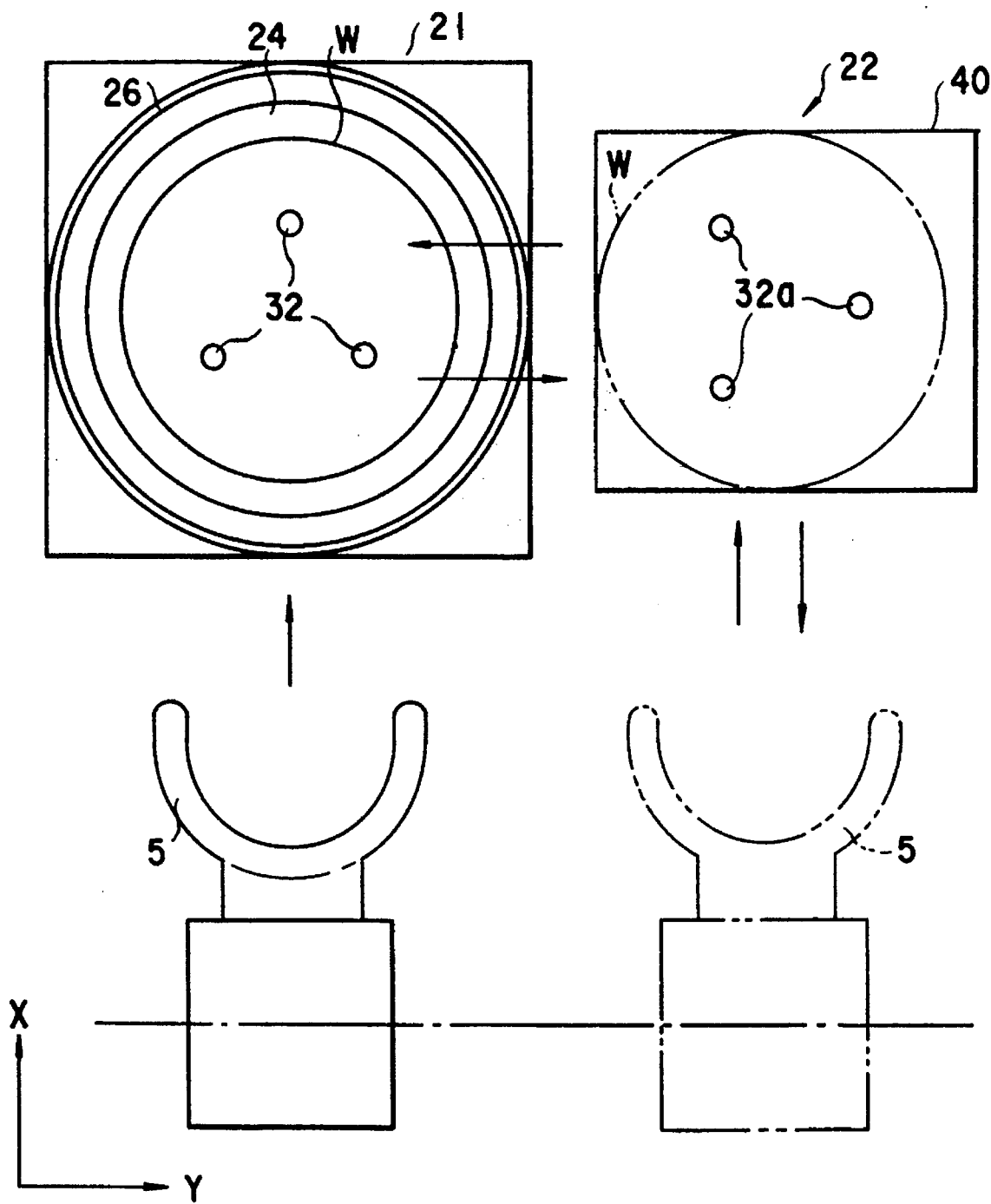
FIG. 19 is a plan view showing the heat-treating apparatus intended to explain the other heat-treating method.

After the cooling of the wafer W is finished, the second support pins 32a are lifted, as shown in FIG. 18, to lift the wafer W from the cooling holder 40 (step S92). As shown in FIGS. 19 and 15B, the main arm 5 is inserted between the wafer W and the lower plate member 42 (step S93). The second support pins 32a are lowered to transfer the wafer W from them to the main arm 5 (step S94). The wafer W is carried from the waiting section 22 (step S95).

According to the above-described sixth embodiment, cooling and temperature-adjusting of the wafer W can be achieved at the waiting section 22 because the second support pins 32a are arranged at the waiting section 22. When the cooling and temperature-adjusting of the wafer W is started while the cooling holder 40 is being moved from the heat-treating section 21 to the waiting section 22, the time needed can be made shorter.

According to the sixth embodiment, the cooling and temperature-adjusting of the wafer W can be attained at a place remote from the above of the stage 24. The influence of heat radiated from the stage 24 can be thus made less. This enables temperature distribution to be made much more uniform in a plane of the wafer W.

The heat-treating method according to a seventh embodiment of the present invention will be described with reference to FIGS. 18, 19 and 21.

Steps S101–S106 are substantially same as steps S81–S86 in the sixth embodiment. The shutter 26 is opened (step S106) and the cooling holder 40 is inserted into the chamber 30 at the heat-treating section 21 (step S107). Current is previously supplied to Peltier elements 44a and 44b this time to keep the cooling holder 40 cool. The wafer W is thus enclosed by the low temperature cooling holder 40 and the cooling of the wafer W is therefore started at the same time when the cooling holder 40 is inserted into the chamber 30 (step S108). The first support pins 32 are lowered to transfer the wafer W from them to the cooling holder 40 (step S109).

The cooling holder 40 is then retreated from the chamber 30 while holding the wafer W (step S110). After the cooling holder 40 is moved from the heat-treating section 21 to the waiting section 22, the shutter 26 is closed (step S111). The wafer W is cooled to room temperature (or about 23° C.) at the waiting section 22.

After the cooling of the wafer W is finished, the second support pins 32a are lifted to lift the wafer W from the cooling holder 40 (step S112), as shown in FIG. 18. As shown in FIGS. 19 and 15B, the main arm 5 is inserted between the wafer W and the lower plate member 42 (step S113). The second support pins 32a are lowered to transfer the wafer W from them to the main arm 5 (step S114). The wafer W is then carried out of the waiting section 22 (step S115).

Although the heat-treating method and apparatus of the present invention have been used for the semiconductor wafer coating and developing system in the above-described cases, they can also be applied to other systems in which semiconductor wafers are heated, cooled and temperature-adjusted. In addition, they can also be used to heat-treat other substrates such as LCD and CD ones.

According to the present invention as described above, the following merits can be achieved.

After the substrate is heated, it is lifted from the wafer-heating stage and immediately cooled by the cooling holder. The time during which the substrate is heat-treated can be thus shortened to a greater extent, and temperature distribution can be made more uniform in a plane of the substrate.

The substrate is cooled at the waiting section as well as at the heat-treating section. The influence of heat radiated from the wafer-heating stage can be thus made as little as possible. In addition, the throughput can be increased because the substrate can be cooled even while it is being moved from the heat-treating section to the waiting section.

The heat insulating means is inserted between the wafer-heating stage and the cooling holder. Heat influence added from the wafer-heating stage to the substrate can be thus made as little as possible.

Non-oxide gas is blown to the substrate in the cooling holder. The cooling of the substrate can be thus promoted in non-oxidizing gas atmosphere and temperature distribution can also be made much more uniform in a plane of the substrate.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A heat-treating method of heating and cooling a substrate comprising the steps of;

(a) carrying the substrate into a heat-treating section by a main arm and mounting the substrate on a heating stage;

(b) heating the substrate on the heating stage;

(c) lifting the heated substrate from the heating stage;

(d) approaching an approach cooling holder to the substrate thus lifted and cooling it above the heating stage; and (e) carrying the cooled substrate from above the heating stage.

2. The heat-treating method according to claim 1, wherein the cooling step (d) further includes transferring the lifted substrate into the approach cooling holder, carrying the substrate from above the heating stage to any possible position and cooling the substrate by the approach cooling holder.

3. The heat-treating method according to claim 2, wherein the cooling step (d) further includes cooling the substrate by the approach cooling holder even while the substrate is being carried.

4. The heat-treating method according to claim 1, wherein the cooling step (d) further includes approaching the approach cooling holder, which has been previously cooled, to the substrate.

5. The heat-treating method according to claim 1, wherein the cooling step (d) further includes interposing heat insulating means between the lifted substrate and the approach cooling holder to prevent the substrate from being influenced by heat radiated from the substrate-heating stage.

6. The heat-treating method according to claim 5, wherein the heat insulating means is a plate made of material having a low heat transfer coefficient.

7. The heat-treating method according to claim 5, wherein the heat insulating means is a layer of heat insulating air formed between the substrate and the approach cooling holder.

8. The heat-treating method according to claim 1, wherein the cooling step (d) further includes cooling the substrate while keeping the substrate not contacted with the approach cooling holder.

9. The heat-treating method according to claim 1, wherein the cooling step (d) further includes cooling the substrate while keeping the substrate contacted with the approach cooling holder.

10. The heat-treating method according to claim 1, wherein the carry-out step (e) further includes lifting the substrate at a position shifted from above the heating stage, transferring the substrate from the approach cooling holder to the main arm, and carrying the substrate out by the main arm.

11. The heat-treating method according to claim 1, wherein the carry-in step (a) further includes causing the main arm to carry a resist-coated substrate from a non-heat-treating section to the heat-treating section, the cooling step (d) further includes causing the approach cooling holder to carry the resist-coated substrate from the heat-treating section to another heat-treating section, and the carry-out step (e) further includes causing the main arm to carry the resist-coated substrate from the heat-treating section to the non-heat-treating section or another non-heat-treating section.

12. The heat-treating method according to claim 11, wherein the substrate is further cooled at the other heat-treating section.

13. A resist-treating apparatus provided with a heat-treating system unit for heating or cooling a substrate and a non-heat-treating system unit for neither heating nor cooling the substrate comprising;
a main arm for carrying the substrate between the heat-treating system unit and the non-heat-treating system unit;
a sub-arm for carrying the substrate in the heat-treating system unit and approaching the substrate to cool the substrate;
a heating stage arranged in the heat-treating system unit to heat the substrate mounted thereon;
a shutter arranged movable relative to the heating stage and serving to form a heat-treating space, enclosing the heating stage, when the substrate is to be heated, and communicate the heat-treating space with a waiting section when the substrate is not to be heated; and
lifter means for lifting the substrate from the heating stage.

14. The resist-treating apparatus according to claim 13, further comprising second lifter means arranged remote from the heating stage to lift the substrate from the sub-arm.

15. The resist-treating apparatus according to claim 13, further comprising a heat insulating plate interposed between the heating stage and the sub-arm.

16. The resist-treating apparatus according to claim 13, further comprising means for supplying air between the heating stage and the sub-arm and means for sucking air thus supplied, wherein a layer of heat insulating air is formed between the heating stage and the sub-arm while supplying the air through the air supply means and sucking the air through the air suction means.

17. The resist-treating apparatus according to claim 13, wherein the sub-arm includes means for blowing non-oxidizing gas to the substrate.

18. The resist-treating apparatus according to claim 13, wherein the sub-arm includes a plurality of spacer members for supporting the substrate while partly contacting a peripheral portion of the substrate.

19. The resist-treating apparatus according to claim 13, wherein the non-heat-treating system unit includes at least one of resist coating means and developing means.

20. The resist-treating apparatus according to claim 13, wherein the heat-treating system unit includes a cooling stage for cooling the substrate.

21. A heat-treating apparatus provided with a heat-treating section and a waiting section for heating and cooling a substrate comprising;
a main arm for carrying the substrate into the heat-treating section;
an approach cooling holder arranged movable at the waiting section and serving to approach the substrate to cool and carry the substrate;
a heating stage arranged at the heat-treating section and serving to heat the substrate mounted thereon;
a shutter arranged movable relative to the heating stage and serving to enclose the heating stage to form a heat-treating space when the substrate is to be heated and communicate the heat-treating space with the waiting section when the substrate is not to be heated; and
lifter means for lifting the substrate from the heating stage.

22. The heat-treating apparatus according to claim 21, further comprising second lifter means arranged at the waiting section to lift the substrate from the approach cooling holder.

23. The heat-treating apparatus according to claim 21, further comprising a heat insulating plate interposed between the heating stage, and the approach cooling holder.

24. The heat-treating apparatus according to claim 21, further comprising means for supplying air between the heating stage and the approach cooling holder and means for sucking air thus supplied, wherein a layer of heat insulating air is formed between the heating stage and the approach cooling holder while supplying air through the air supply means and sucking the air through the air suction means.

25. The heat-treating apparatus according to claim 21, wherein the approach cooling holder includes means for blowing non-oxidizing gas to the substrate.

26. The heat-treating apparatus according to claim 21, wherein the approach cooling holder includes a plurality of spacer members for supporting the substrate while partly contacting a peripheral portion the substrate.

27. The heat-treating apparatus according to claim 21, wherein the main arm includes a drive mechanism for moving the main arm between the heat-treating section and a non-heat-treating section, and the approach cooling holder includes a drive mechanism for driving moving approach cooling holder between the heat-treating section and another heat-treating section.

28. The heat-treating apparatus according to claim 21, wherein said another heat-treating section includes a cooling stage for cooling the substrate mounted thereon.

* * * * *